United States Patent [19]

Wyles et al.

[11] Patent Number: 5,043,820
[45] Date of Patent: Aug. 27, 1991

[54] FOCAL PLANE ARRAY READOUT EMPLOYING ONE CAPACITIVE FEEDBACK TRANSIMPEDANCE AMPLIFIER FOR EACH COLUMN

[75] Inventors: Richard H. Wyles, Cardiff; James L. Gates, Vista; Steven D. Gaalema, Encinitas, all of Calif.

[73] Assignee: Hughes Aircraft Company, Los Angeles, Calif.

[21] Appl. No.: 329,229

[22] Filed: Mar. 27, 1989

[51] Int. Cl.$^5$ .............................................. H04N 5/30
[52] U.S. Cl. .......................... 358/213.28; 250/208.1; 358/212; 358/213.27
[58] Field of Search ............... 250/208.1; 358/213.12, 358/212, 213.28, 213.27

[56] References Cited

U.S. PATENT DOCUMENTS

| | | | |
|---|---|---|---|
| 3,852,714 | 12/1974 | Carson | 250/208.1 |
| 3,949,162 | 4/1976 | Malueg | 258/213.29 |
| 4,345,148 | 8/1982 | Pines et al. | 358/213.15 |
| 4,529,886 | 7/1985 | Yokayama et al. | 358/212 |
| 4,786,831 | 11/1988 | Morse et al. | 307/490 |
| 4,814,629 | 3/1989 | Arnold | 358/105 |

OTHER PUBLICATIONS

Design Consideration and Performance of a new MOS Imaging Device, Haruhisa Ando, et al, IEEE Transactions on Electron Devices, vol. ED-32, No. 8, pp. 1484–1489.

A Solid State Color Video Camera with a Horizontal Readout MOS Imager, Noda et al, IEEE Transactions on Consumer Electronics, vol. CE-32, No. 3, pp. 329–335.

Primary Examiner—Joseph A. Orsino
Assistant Examiner—Jill Jackson
Attorney, Agent, or Firm—W. C. Schubert; W. K. Denson-Low

[57] ABSTRACT

A readout circuit for use with a focal plane array that employs a single transistor in each unit cell and a single capacitive feedback transimpedance amplifier to process the outputs of each column of detector elements of the array. The capacitive feedback transimpedance amplifiers extract the signals associated with the pixels along a particular row of the array. The present invention permits high performance readouts to be constructed with very little circuitry in the unit cells. Only a single minimum sized transistor switch is required in each unit cell to perform readout and reset functions for the array. In the disclosed embodiment, the readout circuit comprises an array of unit cells, each cell comprising a detector input circuit, a single transistor and a single charge storage capacitor. Row address circuits are coupled to the cells in each row of the array. A plurality of capacitive feedback transimpedance amplifiers are coupled to the cells in each column of the array. The amplifiers process charge derived from the detector elements and stored in the charge storage capacitor of each unit cell. Column multiplexing circuits multiplex the output signals provided by each of the amplifiers. Column address circuits are coupled to the column multiplexing circuits which couple output signals from each of the multiplexer circuits as the output from the readout circuit.

15 Claims, 2 Drawing Sheets

FOCAL PLANE ARRAY READOUT EMPLOYING ONE CAPACITIVE FEEDBACK TRANSIMPEDANCE AMPLIFIER FOR EACH COLUMN

BACKGROUND

The present invention generally relates to focal plane arrays and more particularly to a focal plane array readout that employs a single capacitive feedback transimpedance amplifier for each column in the focal plane array.

Existing high performance direct readout devices for focal plane arrays generally require several transistors in each unit cell, a unit cell being the circuit that stores charge from the detector elements of the focal plane array. Typically the number of transistors employed in the unit cell is four. Consequently, it is generally not possible to build monolithic focal plane arrays with small unit cells and high fill factors, meaning the ratio of detector area to total unit cell area. For hybrid focal plane arrays, input circuit performance is generally compromised using such conventional circuits. Charge coupled device readouts also require large amounts of space in the unit cell, and therefore have similar drawbacks.

Readout devices have been developed which require only two transistors in the unit cell. Such devices are described in a publication entitled "A Solid State Color Video Camera with a Horizontal Readout MOS Imager," authored by Masaru Noda, et al, published in IEEE Transactions on consumer Electronics, Vol. CE-32, No. 3, August 1986. In addition to requiring more space in the unit cell this approach requires a very high speed amplifier with low noise, a combination that is very difficult to achieve in practice.

Single transistor unit cells have been used in the past for reading out photodiode arrays. However, the reported devices have employed signal extraction circuitry, such as feedback enhanced direct injection circuits, whose noise performance is somewhat less than desirable. Typical of such single transistor unit cells are those referenced in "Design Consideration and Performance of a New MOS Imaging Device," authored by Haruhisa Ando, et al, in IEEE Transactions on Electron Devices, Vol ED-32, No. 8, August 1985.

SUMMARY OF THE INVENTION

In order to overcome some of the limitations of conventional focal plane readout devices, including relatively large unit cells and less than desirable circuit performance, the present invention provides for a readout device that employs a single transistor in each unit cell. In addition, a single capacitive feedback transimpedance amplifier is employed to process the outputs of each column of detector elements of the array. The capacitive feedback transimpedance amplifiers extract the signals associated with the pixels along a particular row of the array.

The present invention permits high performance readouts to be constructed with very little circuitry in the unit cells. Only a single minimum sized transistor switch is required in each unit cell to perform the readout and reset functions for the array. The remaining space in the unit cell is available to achieve high detector fill factors in monolithic focal plane arrays, or improved input circuit performance in hybrid focal plane arrays.

More specifically, in the disclosed embodiment, the present invention comprises a readout circuit for use with a focal plane array of detector elements. The readout circuit comprises an array of unit cells, each cell comprising a detector input circuit, a single transistor and a single charge storage capacitor. A plurality of row address circuits are individually coupled to the cells in a respective rows of the array. A plurality of capacitive feedback transimpedance amplifiers are individually coupled to the cells in a respective columns of the array. The amplifiers process charge derived from the detector elements and stored in the charge storage capacitor of each unit cell.

A plurality of column multiplexing circuits are coupled to respective ones of the capacitive feedback transimpedance amplifiers which multiplex the output signals provided by each of the amplifiers. A plurality of column address circuits are respectively coupled to the column multiplexing circuits which couple output signals from each of the multiplexer circuits as the output from the readout circuit.

BRIEF DESCRIPTION OF THE DRAWING

The various features and advantages of the present invention may be more readily understood with reference to the following detailed description taken in conjunction with the accompanying drawings, wherein like reference numerals designate like structural elements, and in which:

FIG. 1b shows a diagram of a unit cell of the readout circuit of FIG. 1a; and

DETAILED DESCRIPTION

Figure 1A:
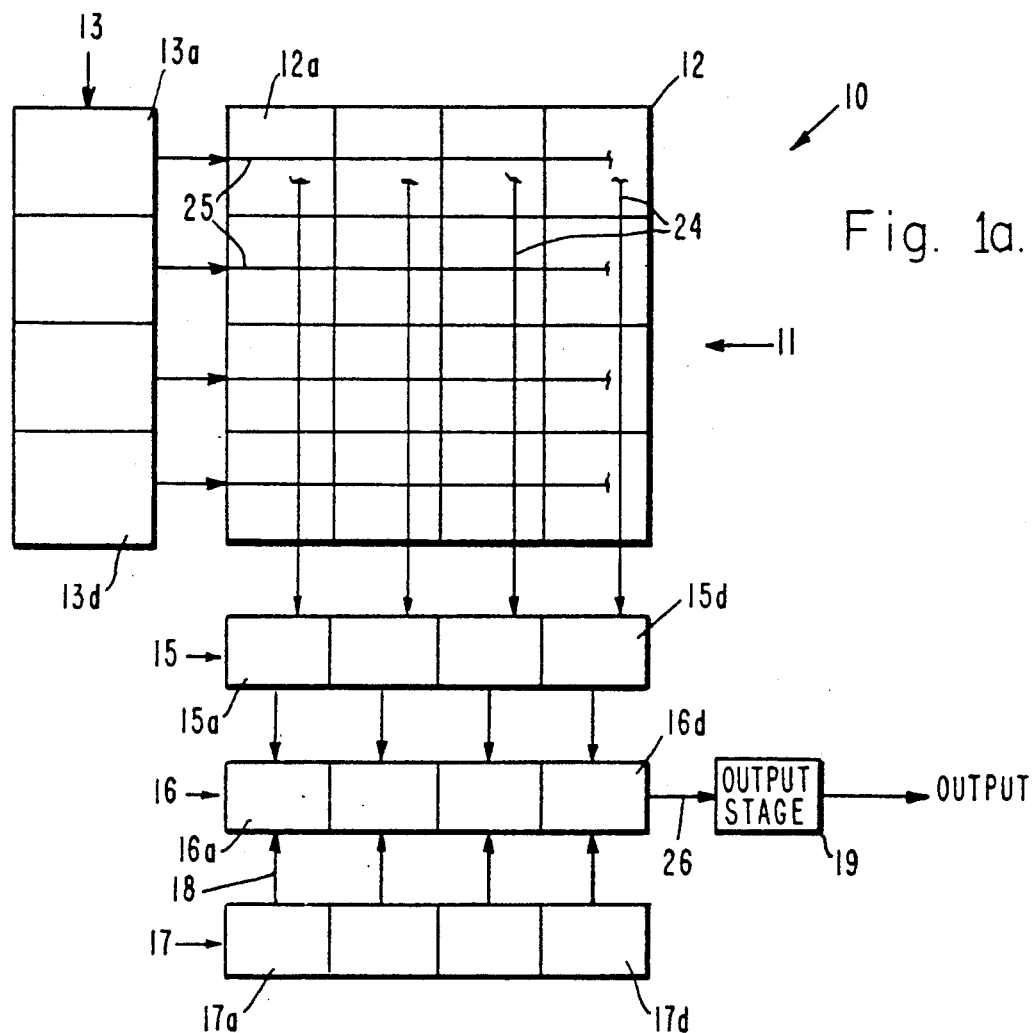
FIG. 1a shows a block diagram of a focal plane array readout circuit in accordance with the principles of the present invention.

Referring to FIG. 1a, a block diagram of a focal plane array readout circuit 10 in accordance with the principles of the present invention is shown. The readout circuit 10 comprises an array 11 of unit cells 12, shown in FIG. 1a as a 4×4 array of cells. Row address circuitry 13 comprising a plurality of row (Y) address circuits 13a-13d, are coupled to each of the cells 11 in a particular row of the array 11. The specific interconnection to the cells 12 will be described with reference to FIG. 1b.

Figure 1B:
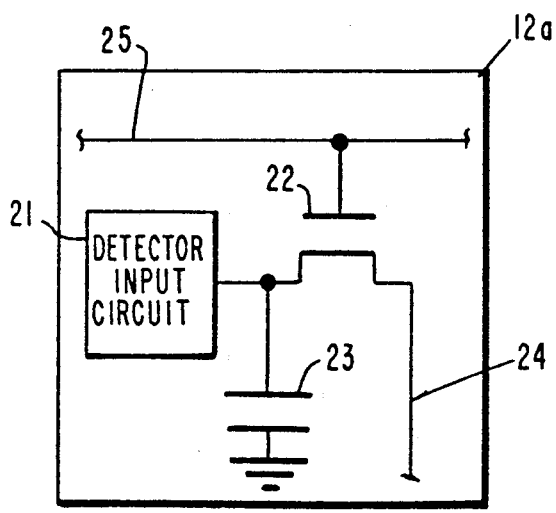

With reference to FIG. 1b, a diagram of a unit cell of the readout device 10 of FIG. 1a is shown. The unit cell 12 comprises a detector input circuit 21, whose input is coupled to a detector element in the focal plane array, and whose output is coupled through a unit cell transistor 22 which operates as a switch. A charge storage capacitor 23 is coupled from a point between the detector input circuit 21 and the transistor 22 and ground. The gate of the transistor 22 is coupled to a selected row address circuit 13a-13d employed to address the row in which the particular cell 12 resides along a horizontal signal line 25. The drain of the transistor 22 is coupled to a vertical signal line 24 which couples charge out of the unit cell 12.

Referring again to FIG. 1a, the vertical signal lines of each column of the array are respectively coupled to separate capacitive feedback transimpedance amplifiers 15a-15d. Each capacitive feedback transimpedance amplifier 15a-15d is coupled to the unit cells in a particular column of the array. Outputs of each of the capacitive feedback transimpedance amplifiers 15a-15d are coupled to column multiplexing circuits 16a-16d. Capacitive feedback transimpedance amplifiers 15a-15d are generally well-known in the art, and reference is made to U.S. Pat. No. 4,786,831, entitled "Integrating Capacitively Coupled Transimpedance Amplifiers," issued to Morse et al, which illustrates one such transimpedance amplifier.

Column address circuits 17a-17d are respectively coupled to each of the column multiplexing circuits 16a-16d and are employed to address each of the column multiplexing circuits 16a-16d in order to read out the signals therefrom as the output signals from the readout circuit 10. Also shown in FIG. 1a is an output driver 19 that is coupled to the column multiplexing circuits 16a-16d in order to drive the output signal from the readout circuit 10. This output driver 19 may also be used to provide an amplified output signal, if desired. However, in some applications, this output driver 19 may not be required, and hence it is an optional circuit.

Figure 2:
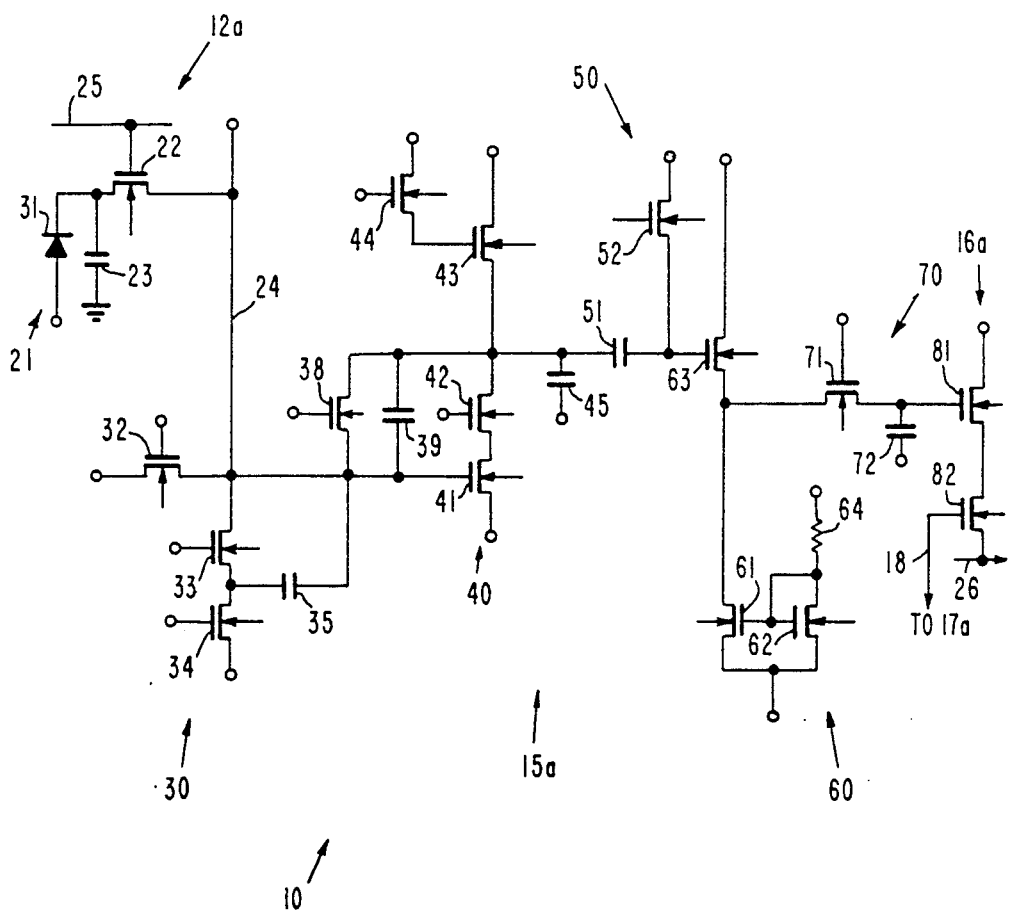
FIG. 2 shows a detailed diagram of a capacitive feedback transimpedance amplifier and unit cell employed in a focal plane array readout circuit in accordance with the principles of the present invention.

Referring to FIG. 2, a detailed diagram of a capacitive feedback transimpedance amplifier 15a and unit cell 12 employed in a focal plane array readout circuit 10 in accordance with the principles of the present invention is shown. The circuit implementation is relatively straight forward, and as shown in the drawings, comprises the following subcircuits. The readout circuit 10 comprises the unit cell 12, which includes a detector 31, which may be a Schottky detector or a mercury cadmium telluride detector, for example, whose output is coupled through the unit cell transistor 22.

A detector reset transistor 32 and an optional charge injection circuit 30 comprising two transistors 33, 34 and a capacitor 35 is coupled to the input of the capacitive feedback transimpedance amplifier 15a. The charge injection circuit 30 injects charge into the capacitive feedback transimpedance amplifier 15a to adjust its operating point. The capacitive feedback transimpedance amplifier 15a includes an amplifier reset switch 38 and feedback capacitor 39, and its primary amplifier circuit 40 comprises four transistors 41, 42, 43, 44 and a capacitor 45. This amplifier circuit 40 operates as a conventional inverting amplifier with a dynamically bootstrapped load. The amplifier circuit 40 is also one embodiment of many, which could be implemented to provide the desired amplification functions.

A clamp circuit 50 comprising coupling capacitor 51, and transistor 52 interfaces between the capacitive feedback transimpedance amplifier 15a and a source follower buffer circuit 60 comprising three transistors 61, 62, 63 and a resistor 64. The clamp circuit 50 reduces reset noise and eliminates DC nonuniformities in the capacitive feedback transimpedance amplifier 15a. The buffer circuit 60 isolates the clamp capacitor 51 from capacitor 72 to prevent interaction that would result in a gain reduction in that portion of the readout circuit 10.

The output of the buffer circuit 60 is coupled through a sample and hold circuit 70 comprising a transistor 71 and a capacitor 72. The sample and hold circuit 70 isolates the signal stored in capacitor 72 from the capacitive feedback transimpedance amplifier 15a during column multiplexing operations. A column multiplexer circuit 16a comprises two transistors 81, 82. The output of the column multiplexer circuit 16a couples signals to the output driver circuit 19 by way of output bus line 26.

For purposes of completeness, the following typical bias and clock voltages may be applied to the circuit of FIG. 2 as shown in the following Table 1.

TABLE 1

Typical Bias and Clock Voltage (Volts)

| Item | Bias | Item | Clock Low | Clock High |
|---|---|---|---|---|
| Anode of detector 31 | 0 | Row select (gate of 22) | 0 | 8 |
| Left diffusion of transistor 32 | 5 | Gate of 32 | 0 | 8 |
| Bottom diffusion of transistor 34 | 1 | Gate of 33 | 0 | 8 |
| Bottom diffusion of transistor 41 | 2 | Gate of 34 | 0 | 8 |
| Gate of transistor 42 | 3 | Gate of 38 | 0 | 8 |
| Top diffusion of transistor 44 | 4 | Gate of 44 | 0 | 8 |
| Top diffusion of transistor 43 | 8 | Gate of 52 | 0 | 8 |
| Bottom plate of capacitor 45 | 0 | Gate of 71 | 0 | 8 |
| Top diffusion of transistor 52 | 4 | Column select (gate of 82) | 0 | 8 |
| Top diffusion of transistor 63 | 8 | | | |
| Bottom diffusion of transistor 61 | 4 | | | |
| Bottom diffusion of transistor 62 | 4 | | | |
| Bias applied above resistor 64 | 8 | | | |
| Bottom plate of capacitor 72 | 0 | | | |
| Top diffusion of transistor 81 | 8 | | | |

The operation cycle of the circuit described in FIGS. 1 and 2 is as follows. Before a new row of unit cells 12 in the array 11 is selected, all capacitive feedback transimpedance amplifiers 15 are reset using the reset transistor 38. This action puts the capacitive feedback transimpedance amplifiers 15a-15d into a mode in which they sense charge on their inputs. A new row of input cells 12 is then selected wherein the row address circuitry 13 generates a pulse which activates the new row. This pulse turns on the transistors 22 in each unit cell 12 in the selected row. The charge stored in the storage capacitor 23 in the unit cell 12, which comprises the integrated photocurrent from the detector element to which a unit cell 12 is coupled, is thus transferred to the vertical signal line 24.

The respective capacitive feedback transimpedance amplifier 15a-15d responds by producing an output signal which is proportional to the stored charge. Since there is a capacitive feedback transimpedance amplifier 15 associated with each column in the array 11, all columns are processed simultaneously. After the outputs of the capacitive feedback transimpedance amplifier 15 have stabilized, the signal levels are then read out. The sample and hold circuit 70 is employed to isolate the signals from the capacitive feedback transimpedance amplifier 15 prior to the readout phase. The signals are read out using standard multiplexing techniques. The column address circuitry 17 causes successive columns to be enabled and the signal from the column addressed at a particular instant is connected to the output bus line 26 and driven from the readout circuit 10 by the output stage 19.

After the signal from each column has been read out, the unit cells 12 along the currently addressed row are reset using the reset transistor 32. This is done by simultaneously forcing all vertical signal lines 24 to a common reset voltage. Since the transistors 22 in the unit cells 12 along this row are still turned on, the charge storage capacitors 23 are reset to the voltage on the vertical signal line 24. The row enable pulse from the row address circuits 13 is then deactivated, leaving the charge storage capacitors 23 at the reset voltage. These capacitors 23 integrate photocurrent during the next frame period, until this row is again addressed.

The operating cycle described above is then repeated for the next row. The capacitive feedback transimpedance amplifiers 15 are reset. The next row of unit cells 12 is activated, and the rest of the readout sequence is repeated.

The circuit configuration of FIG. 2 is only one embodiment of many possible embodiments which realize the present invention. The circuit of FIG. 2 includes a variety of extra features that improve its performance. For example, an optional sample and hold and/or clamp and sample circuits, such as sample and hold circuit 70, is employed to minimize noise and nonuniformities. Bandwidth limiting may be employed to reduce noise. Precharging circuits, such as the optional charge injection circuit 30 is employed to reduce noise, control dynamic range, and allow analog nonuniformity compensation. These and other techniques may be used to optimize the design of the capacitive feedback transimpedance amplifier 15 to meet the requirements of a specific application.

Thus there has been described a new and improved focal plane array readout circuit which provides for the use of single transistor unit cells, and for a single capacitive feedback transimpedance amplifier circuit for each column in the readout array. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A focal plane array readout circuit for use with a focal plane array having a predetermined number of rows and columns of detector elements, said readout circuit comprising:
   an array of unit cells, each cell comprising charge storage and transfer means for receiving and storing charge derived from the detector elements of the focal plane array;
   row address means coupled to each row of unit cells of the array;
   a plurality of capacitive feedback transimpedance amplifiers, one capacitive feedback transimpedance amplifier coupled to the cells in each column of unit cells of the array for processing charge stored in the charge storage and transfer means of the unit cells;
   column multiplexing means coupled to respective ones of the capacitive feedback transimpedance amplifiers for multiplexing output signals provided thereby; and
   column address means coupled to the column multiplexing means for addressing each of the column multiplexing means and for coupling output signals provided thereby out of the readout circuit.

2. The focal plane array readout circuit of claim 1 which further comprises:
   charge injection means coupled to the input of each capacitive feedback transimpedance amplifier.

3. The focal plane array readout circuit of claim 1 which further comprises:
   clamp circuit means coupled to the output of each capacitive feedback transimpedance amplifier.

4. The focal plane array readout circuit of claim 1 which further comprises:
   buffer circuit means coupled to the output of each capacitive feedback transimpedance amplifier.

5. The focal plane array readout circuit of claim 4 which further comprises:
   sample and hold circuit means coupled to the buffer circuit means.

6. Focal plane array readout circuit for use with a focal plane array having a predetermined number of rows and columns of detector elements, said readout circuit comprising:
   an array of unit cells, each cell comprising a detector input circuit, a single transistor and a single charge storage capacitor;
   a plurality of row address circuits respectively coupled to the cells in a selected row of the array;
   a plurality of capacitive feedback transimpedance amplifiers equal to the number of columns of detector elements, each amplifier respectively coupled to the cells in a selected column of the array for processing charge stored in the charge storage capacitor of each unit cell in parallel with the unit cells in the other columns;
   a plurality of column multiplexing circuits coupled to respective ones of the capacitive feedback transimpedance amplifiers for multiplexing output signals provided by each of the amplifiers; and
   a plurality of column address circuits respectively coupled to the column multiplexing circuits for coupling output signals provided by each of the multiplexers as the focal plane array output from the readout circuit.

7. The focal plane array readout circuit of claim 6 which further comprises:
   charge injection means respectively coupled to the inputs of the plurality of capacitive feedback transimpedance amplifiers for injecting charge into the capacitive feedback transimpedance amplifiers to adjust the operating point thereof.

8. The focal plane array readout circuit of claim 6 which further comprises:
   clamp circuit means respectively coupled to the outputs of the plurality of capacitive feedback transimpedance amplifiers for reducing reset noise and eliminating DC nonuniformities therein.

9. The focal plane array readout circuit of claim 6 which further comprises:
   buffer circuit means respectively coupled to the outputs of the plurality of capacitive feedback transimpedance amplifiers for preventing gain reduction therein.

10. The focal plane array readout circuit of claim 9 which further comprises:
    sample and hold circuit means respectively coupled to each of the buffer circuit means for isolating the respective capacitive feedback transimpedance amplifiers during column multiplexing operations.

11. Focal plane array readout circuit for use with a focal plane array having a predetermined number of rows and columns of detector elements, said readout circuit comprising:

an array of unit cells, each cell comprising a detector input circuit, a single transistor and a single charge storage capacitance;

a plurality of row address circuits respectively coupled to respective gates of the transistors in a selected row of unit cells of the array;

a plurality of capacitive feedback transimpedance amplifiers equal to the number of columns of detector elements, each capacitive feedback transimpedance amplifier coupled to the transistors in a selected column of unit cells of the array for processing charge stored in the charge storage capacitance of each unit cell of a selected row of the unit cells in parallel;

a plurality of column multiplexing circuits coupled to respective ones of the capacitive feedback transimpedance amplifiers for multiplexing output signals provided by each of the amplifiers; and a plurality of column address circuits respectively coupled to the column multiplexing circuits for addressing each of the plurality of column multiplexing circuits for coupling output signals provided by each of the multiplexer circuits as the focal plane array output from the readout circuit.

12. The focal plane array readout circuit of claim 11 which further comprises:

a plurality of charge injection circuits respectively coupled to the inputs of each of the capacitive feedback transimpedance amplifiers.

13. The focal plane array readout circuit of claim 11 which further comprises:

a plurality of clamp circuits respectively coupled to the output of each of the capacitive feedback transimpedance amplifiers.

14. The focal plane array readout circuit of claim 11 which further comprises:

a plurality of buffer circuits respectively coupled to the output of each of the capacitive feedback transimpedance amplifiers.

15. The focal plane array readout circuit of claim 14 which further comprises:

a plurality of sample and hold circuits respectively coupled to the buffer circuits.

* * * * *